(12) United States Patent  
Wyatt

(10) Patent No.: US 8,590,332 B2
(45) Date of Patent: *Nov. 26, 2013

(54) APPARATUS AND METHOD FOR A THERMAL MANAGEMENT OF A MEMORY DEVICE

(75) Inventor: David A. Wyatt, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 243 days.

This patent is subject to a terminal disclaimer.

(21) Appl. No.: 12/849,313

(22) Filed: Aug. 3, 2010

(65) Prior Publication Data

US 2011/0029150 A1 Feb. 3, 2011

Related U.S. Application Data

(63) Continuation of application No. 11/305,519, filed on Dec. 16, 2005, now Pat. No. 7,765,825.

(51) Int. Cl.
*F25D 23/12* (2006.01)
*G01K 1/08* (2006.01)
*G05D 23/00* (2006.01)

(52) U.S. Cl.
USPC .......................... 62/259.2; 702/132; 700/299

(58) Field of Classification Search
USPC .......... 62/259.2; 365/211, 212; 702/130, 132; 700/299
See application file for complete search history.

(56) References Cited

U.S. PATENT DOCUMENTS

| 5,864,781 | A  | * | 1/1999  | White ........................... 702/182 |
| 6,701,272 | B2 | * | 3/2004  | Cooper et al. ................ 702/132 |
| 6,704,877 | B2 |   | 3/2004  | Cline et al. |
| 7,765,825 | B2 | * | 8/2010  | Wyatt ........................... 62/259.2 |
| 2001/0014049 | A1 | * | 8/2001 | Woo et al. ..................... 365/211 |
| 2004/0218355 | A1 | * | 11/2004 | Bash et al. .................... 361/690 |

OTHER PUBLICATIONS

"Mobile Platform Memory Module Thermal Sensor Component Specification", Item No. 1640.07, JC-42.4, Ballot Proposal, Nov. 9, 2004, pp. 1-18.
Eric C. Samson et al., "Interface Material Selection and a Thermal Management Technique in Second-Generation Platforms Built on Intel Centrino Mobile Technology", Intel Technology Journal, vol. 09, Issue 01, Feb. 17, 2005, pp. 75-86.
"System Management Bus (SmBus) Specification", Version 2.0, SBS Implementers Forum, Aug. 3, 2000, pp. 1-59.

* cited by examiner

*Primary Examiner* — Chen Wen Jiang
(74) *Attorney, Agent, or Firm* — Kacvinsky Daisak PLLC

(57) ABSTRACT

A system and method for thermal management of a memory device is described. In an embodiment, one or more thermal sensors sends a signal to a thermal control module indicating that a pre-determined temperature threshold for a memory device or devices has been reached. The thermal control module may then begin tracking memory thermals or initiate thermal management operations based on the signal and history of memory device temperatures over time.

16 Claims, 9 Drawing Sheets

APPARATUS AND METHOD FOR A THERMAL MANAGEMENT OF A MEMORY DEVICE

CROSS-REFERENCE TO RELATED APPLICATION

This application is a continuation of U.S. application Ser. No. 11/305,519 filed Dec. 16, 2005 entitled "APPARATUS AND METHOD FOR THERMAL MANAGEMENT OF A MEMORY DEVICE".

FIELD

Embodiments of the invention relate generally to thermal management systems, and more specifically to thermal management of memory devices.

BACKGROUND

The memory data access rates required of memory devices is increasing as complex computer applications utilize increasingly powerful processors.

In some cases, applications such as games and user interfaces (UIs) can produce more sustained bandwidth from the system processor and integrated graphics and memory controller (GMCH) chipset, than can be supported by a system memory device over the range of ambient environmental temperatures.

Thermal constraints of modern memory devices play a prominent role in limiting the maximum data access rates that memory device interfaces can currently support.

For Example, memory devices (such as Rambus, Single and Double Data-Rate SDR, DDR, DDR2) may have limited thermal capabilities given their packages and design implementation practicalities, yet the actual memory interface on these devices can support increasingly higher data rates. Even with improvements in device geometry, the maximum thermal power that can be produced by these memory devices can exceed the package capabilities, in sustained throughput scenarios.

The thermal constraints of memory devices are an especially important issue in mobile PC designs where ambient temperatures are not presumed fixed and a volume air-flow over memory devices may not be reliable.

Current solutions addressing thermal constraints in memory devices attempt to infer the memory thermal power which correlates to the casing temperature on the memory device. Throttling (e.g. applying a memory access rate limits), and how-much throttling to apply to control the temperature of the memory may be based upon inferential methods.

For example, "bandwidth counters" apply a bandwidth limit (e.g. by inserting low-energy wait-states into certain types of access cycles) when access burst patterns exceed a defined limit over a period of time. Other solutions include the "virtual temperature sensor" (VTS) which involves inferring the temperature of a memory device through a correlation between memory device power and memory device temperature. In this method, device power is a summation of energy per memory access, and the device current specification.

The uncertainty inherent in bandwidth counters and VTS as thermal management methods for memory devices leads to poor data access rate performance. There is merely a loose correlation between bandwidth and memory device temperature. These solutions can require significant amounts of "guardbanding" (e.g. accounting for error, and inaccuracy) in order to accommodate worst-case conditions when locating a target temperature threshold, and applying memory access rate limits. Unfortunately, this "guardbanding" may cut into normal operating performance, and unnecessarily impact benchmark results.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION

A method and apparatus for thermal management of a memory device are disclosed. In the following description, for purposes of explanation, numerous specific details are set forth in order to provide a thorough understanding of the present invention. It will be apparent, however, to one skilled in the art that the present invention can be practiced without these specific details.

In general, methods and apparatus are described for a thermal control module having an input port that receives a signal from thermal sensor a thermal control module to receive a signal indicating that one of a plurality of temperature thresholds associated with a memory device has been reached. The thermal control module initiates a thermal management operation such as enabling fans, causing the memory device to undergo a refresh operation, limiting a memory access rate, etc. The sensor thermally couples to a memory device to measure an actual temperature of the memory device. The memory access rate limits to the memory device may be based on a signal derived from the measured temperature of the memory device.

Figure 1:
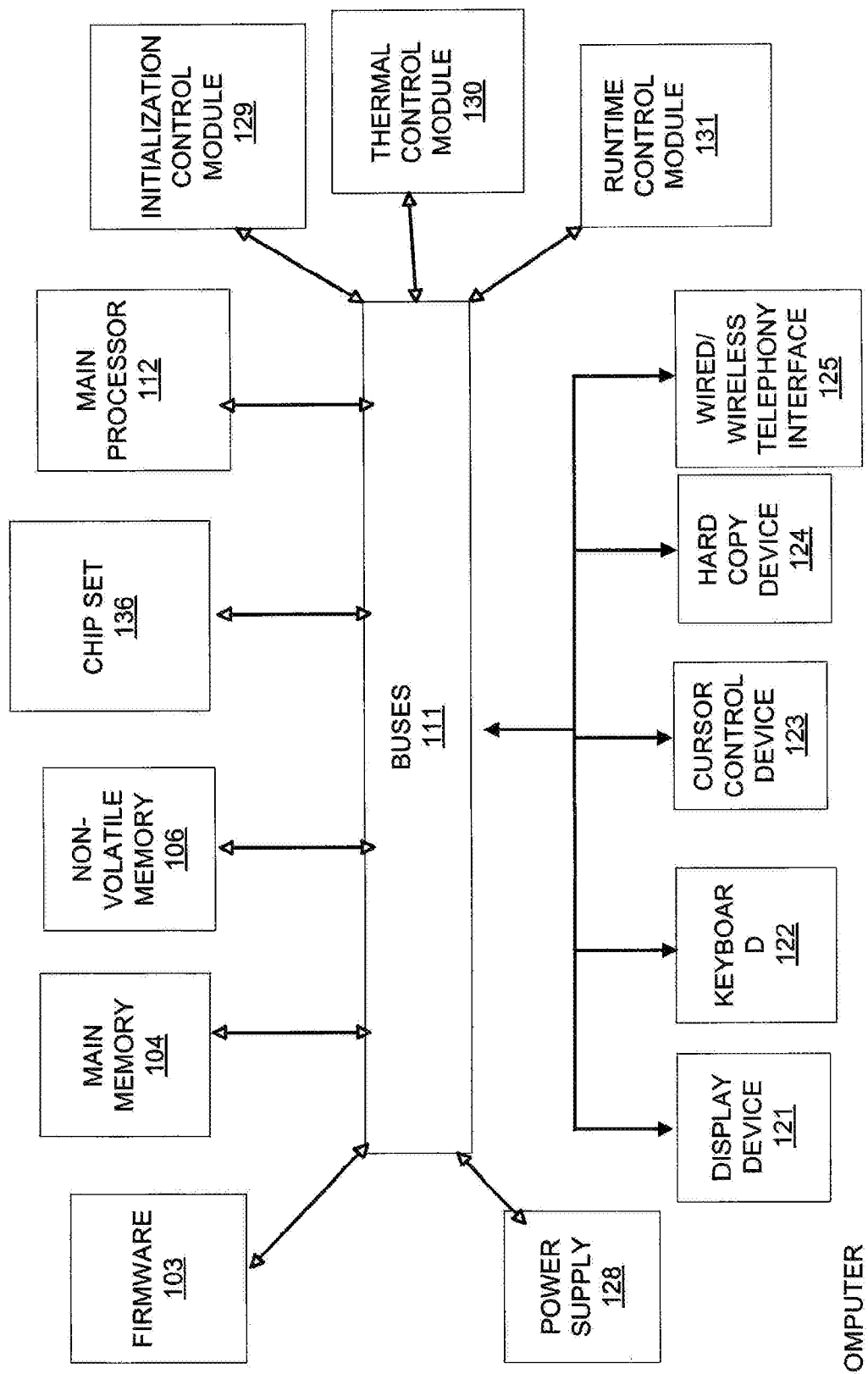
FIG. 1 illustrates a block diagram of an embodiment of a computing system that may manage thermal constraints of a memory device.

FIG. 1 illustrates a block diagram of an example computer system. In an embodiment, computer system 100 comprises a communication mechanism or bus 111 for communicating information, and an integrated circuit component such as a main processing unit 112 coupled with bus 111 for processing information. The main processing unit 112 may consist of one or more processor cores working together as a unit. Computer system 100 may be a mobile device. Examples of mobile devices may be a laptop computer, a cell phone, a personal digital assistant, or other similar device with on board processing power and wireless communications ability that is powered by a battery.

Computer system 100 further comprises a random access memory (RAM) or other dynamic storage device 101 (referred to as main memory) coupled to bus 111 for storing information and instructions to be executed by main processing unit 112. Main memory 104 also may be used for storing temporary variables or other intermediate information during execution of instructions by main processing unit 112.

According to an embodiment, the computer system 100 includes an initialization control module 129 for discovering a memory thermal sensor location and deriving thermal responses according to memory thermal characteristics. The computer system 100 may also include a thermal control module 130 to apply a memory access rate limit response based on signals from a thermal sensor. Computer system 100 may additionally include a runtime control module 131 to provide dynamic thermal responses based on thermal sensor input during runtime of computer system 100.

In an embodiment, initialization control module 129, thermal control module 130, or runtime control module 131 reside in memory 104 and contain processing logic for execution (e.g. BIOS or driver code) by the processor 112. In another embodiment, initialization control module 129, thermal control module 130, or runtime control module 131 contain processing logic that comprises hardware such as circuitry, dedicated logic, programmable, logic, microcode, etc. In yet another embodiment, initialization control module 129, thermal control module 130, or runtime control module 131 contain processing logic that comprises a combination of software and hardware.

Some portions of the detailed descriptions that follow are presented in terms of algorithms and symbolic representations of operations on data bits within a computer system's registers or memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or the like, may refer to the action and processes of a computer system, or similar electronic computing device, that manipulates and transforms data represented as physical (electronic) quantities within the computer system's registers and memories into other data similarly represented as physical quantities within the computer-system memories or registers or other such information storage, transmission or display devices.

Other embodiments of the present invention can be accomplished by way of software. For example, in some embodiments, the present invention may be provided as a computer program product or software which may include a machine or computer-readable medium having stored thereon instructions which may be used to program a computer (or other electronic devices) to perform a process according to the present invention. In other embodiments, processes of the present invention might be performed by specific hardware components that contain hardwired logic for performing the processes, or by any combination of programmed computer components and custom hardware components.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in an embodiment may be included within other embodiments. The following detailed description is, therefore, not to be taken in a limiting sense, and the scope of the present invention is defined only by the appended claims, along with the full scope of equivalents to which such claims are entitled.

Firmware 103 may be a combination of software and hardware, such as Electronically Programmable Read-Only Memory (EPROM) that has the operations for the routine recorded on the EPROM. The firmware 103 may embed foundation code, basic input/output system code (BIOS), or other similar code. The firmware 103 may make it possible for the computer system 100 to boot itself.

Computer system 100 also comprises a read-only memory (ROM) and/or other static storage device 106 coupled to bus 111 for storing static information and instructions for main processing unit 112. The static storage device 106 may store OS level and application level software.

Computer system 100 may further be coupled to a display device 121, such as a cathode ray tube (CRT) or liquid crystal display (LCD), coupled to bus 111 for displaying information to a computer user. A chipset may interface with the display device 121.

An alphanumeric input device (keyboard) 122, including alphanumeric and other keys, may also be coupled to bus 111 for communicating information and command selections to main processing unit 112. An additional user input device is cursor control device 123, such as a mouse, trackball, trackpad, stylus, or cursor direction keys, coupled to bus 111 for communicating direction information and command selections to main processing unit 112, and for controlling cursor movement on a display device 121. A chipset may interface with the input output devices.

Another device that may be coupled to bus 111 is a hard copy device 124, which may be used for printing instructions, data, or other information on a medium such as paper, film, or similar types of media. Furthermore, a sound recording and playback device, such as a speaker and/or microphone (not shown) may optionally be coupled to bus 111 for audio interfacing with computer system 100. Another device that may be coupled to bus 111 is a wireless communication module 125. The wireless communication module 125 may employ a Wireless Application Protocol to establish a wireless communication channel. The wireless communication module 125 may implement a wireless networking standard such as Institute of Electrical and Electronics Engineers (IEEE) 802.11 standard, IEEE std. 802.11-1999, published by IEEE in 1999.

In an embodiment, the software used to facilitate the routine can be embedded onto a machine-readable medium. A machine-readable medium includes any mechanism that provides (i.e., stores and/or transmits) information in a form accessible by a machine (e.g., a computer, network device, personal digital assistant, manufacturing tool, any device with a set of one or more processors, etc.). For example, a machine-readable medium includes recordable/non-recordable media (e.g., read only memory (ROM) including firmware; random access memory (RAM); magnetic disk storage media; optical storage media; flash memory devices; etc.), as well as electrical, optical, acoustical or other form of propagated signals (e.g., carrier waves, infrared signals, digital signals, etc.); etc.

Figure 2:
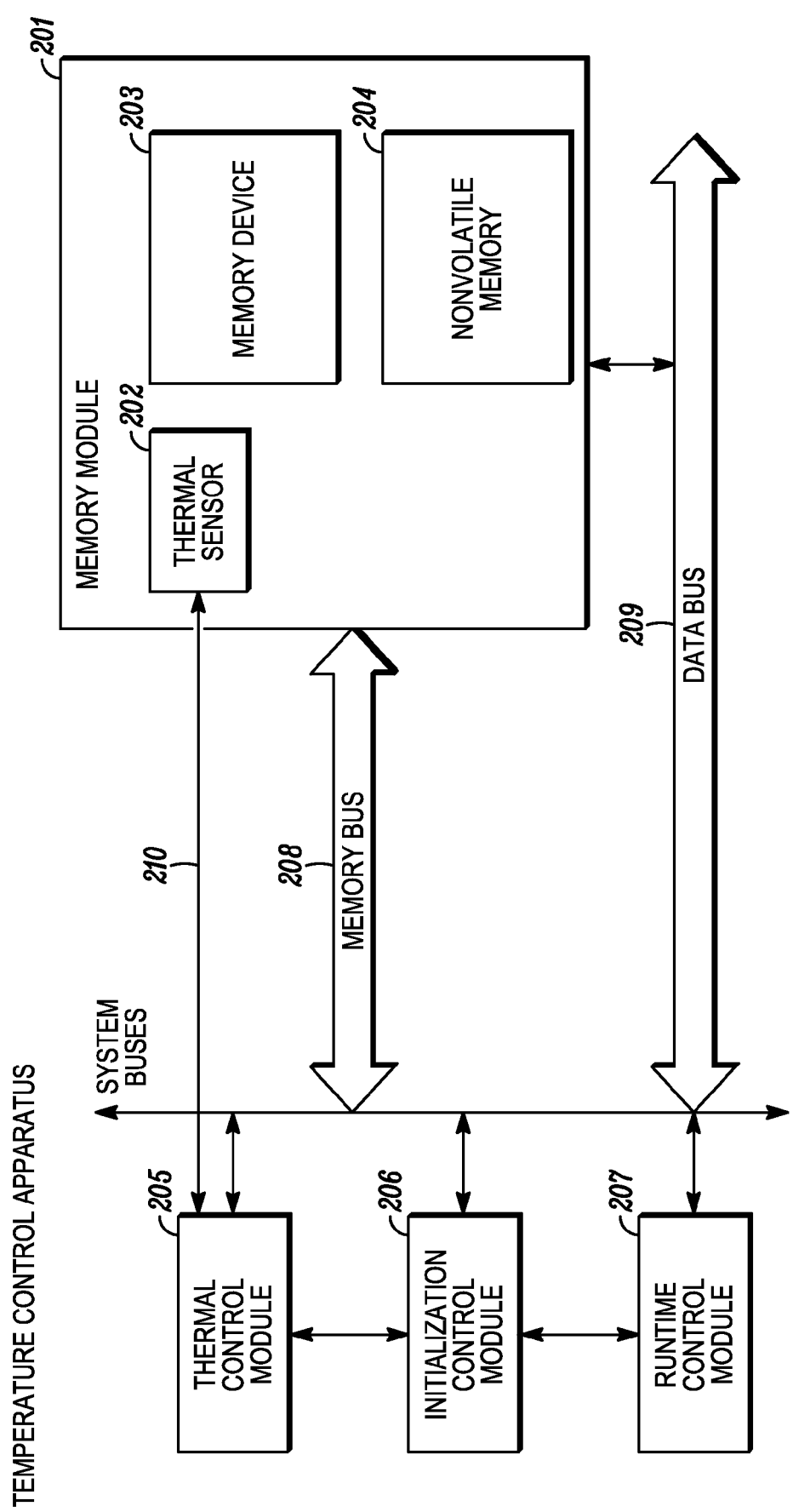
FIG. 2 illustrates a block diagram of an embodiment of a temperature control apparatus comprising elements used in memory device thermal management.

FIG. 2 is a block diagram illustrating embodiments of a temperature control apparatus 200 to manage temperature of a memory device 203. In FIG. 2, a memory module 201 may contain memory device 203, thermal sensor, 202, and nonvolatile memory 204. Memory module 201 may be for example a dual inline memory module (DIMM) or a small outline DIMM (SO-DIMM). Memory device 203 stores data and memory accesses are performed via the memory bus 208 (e.g. read/write). Memory device 202 may be volatile memory (e.g. dynamic random access memory (DRAM) such as synchronous DRAM (SDRAM), single data rate (SDR) double data rate synchronous RAM (DDR2 SDRAM) or Rambus DRAM (RDRAM), static RAM (SRAM)), or nonvolatile memory (e.g., read only memory (ROM) such as flash memory.

Upon sensing a temperature related to the memory device 203, thermal sensor 202 may issue a signal (e.g. hardware interrupt) to thermal control module 205 via the signal connection 210. The signal may indicate that a temperature threshold of the memory has been reached.

A temperature threshold may be for example a defined temperature of interest that is sensed by thermal sensor 202. Thermal sensor 202 may be a temperature sensor (i.e., thermal diode) having a digital to analog converter (DAC) to provide selection of a temperature threshold reference and notification that the temperature threshold has been reached. The thermal sensor 202 may generate an incremental indication of temperature as described above or an analog indication of temperature. Either way, the signal generated by the thermal sensor 202 is derived from the measured temperature of the memory device 203. Thermal sensor 202 may also include additional components such as a data storage area (e.g. registers). Thermal control module 205 may be, for example, circuitry which can be applied to limit overall memory access throughput on an overall or on a per channel basis.

When the thermal control module 205 receives the signal from the thermal sensor 221, thermal control module 205 may limit memory access rate for memory device accesses transferring across the memory bus 208.

Advantageous to managing the temperature of a memory device, desired memory access rate limits can be applied to a memory device based at least in part on actual temperature readings taken in close proximity to the memory device.

In another embodiment, initialization control module 206 may collect information via data bus 209 about thermal sensor's 202 location (e.g. location of the thermal sensor on the memory module) and the memory device's 203 thermal characteristics (e.g. temperature sensitivity, thermal constants, correlations between thermal sensor measurement and memory device temperature) and use the information to compute temperature threshold values and memory access rate limits for the memory device 203.

The data bus 209 may be for example a low speed serial bus such as system management bus (SMBus) as defined in System Management Bus Specification version 2.0 Aug. 3, 2000 by SBS implementers forum. Initialization control module 206 may be software, hardware, or some combination of software and hardware.

In another embodiment, platform thermal characteristics such as thermal characteristics of the area surrounding the memory module 201 (e.g. direction of airflow over memory module and orientation of temperature sensor relative to airflow and the cooling capacity of a mobile device) are also considered in the computation of the thermal threshold values and memory access rate limits for the memory device 203.

In an embodiment, thermal sensor's 202 location, memory device's 203 thermal characteristics and/or platform characteristics may be retrieved via data bus 209 from within a second memory device such as nonvolatile memory 204 (e.g. signal presence detect (SPD)) coupled to memory module 201.

In an embodiment, the initialization control module 206 may infer the thermal characteristics from information in the SPD that describes the memory module 201 (e.g. how many memory devices 203 on the memory module 201, memory devices 203 on one or both sides of memory module 201 and/or how large (memory density in megabits) each memory device 203 is).

Once the initialization control module 206 has computed temperature threshold values for memory device 203, initialization control module 206 may store the values within thermal sensor 202 via data bus 209. Initialization control module 206 may also store the computed memory access rate limits for memory device 203 in thermal control module 205.

In operation, temperatures measured by thermal sensor 202 are compared to threshold values stored within thermal sensor 202. When such a temperature value matches a stored threshold value, a thermal threshold has been reached. Thermal sensor 202 then sends a signal indicating the thermal threshold to thermal control module 205 via signal connection 210. Thermal control module 205 in turn applies one of the memory access rate limits via memory bus 208 to memory device 203 that corresponds to the thermal threshold that was sensed by thermal sensor 202.

Advantageously, temperature control apparatus 200 may calibrate thermal responses according to thermal characteristics of the memory device and its environment. When a temperature threshold value has been sensed, temperature control apparatus 200 may automatically adjust the memory access rate limits to the memory device in order optimize performance within known thermal constraints.

Figure 3:
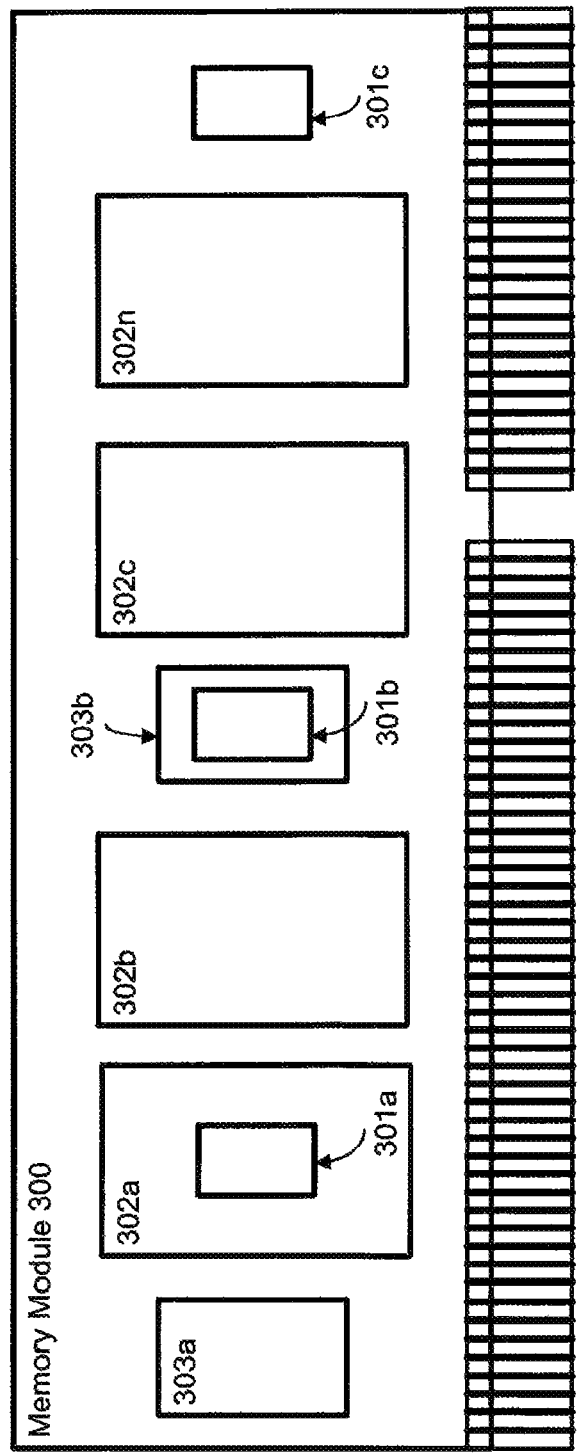
FIG. 3 illustrates a block diagram of an embodiment of a memory module comprising a thermal sensor.

FIG. 3 is a schematic of a memory module 300. As stated above, memory module 300 may be a circuit card such as a DIMM or SO-DIMM. Memory module 300 contains memory devices 302a-302n, additional memory devices such as nonvolatile memories 303a, 303b and thermal sensors 301a-303c. In an embodiment, thermal sensor 301a may be embedded within memory device 302a. When thermal sensor 301a is embedded in memory device 302a, thermal sensor may communicate with initialization control module and runtime control module over memory bus instead of data bus. In another embodiment, thermal sensor 301b may be embedded in nonvolatile memory 303b (e.g. an SPD of a SO-DIMM). In yet another embodiment, thermal sensor 301c may be operable as a stand-alone device on memory module 300. As described above, the location of the thermal sensor 301a, 301b, 301c may be stored in nonvolatile memory 303a and/or 303b (e.g. SPD) and retrieved by initialization control module 206 for computation of temperature thresholds and memory access rate limits for the memory device 203.

Referring again to FIG. 2, in another embodiment, runtime control module may 207 may configure thermal control module to forward temperature threshold indications for a number of temperature threshold values. Accordingly, runtime control module 207 may receive a signal (e.g. software interrupt) from thermal control module 205, indicating that a temperature threshold value has been reached. In particular, after thermal sensor 202 senses that a temperature threshold of the memory device 203 has been reached, thermal sensor 202 may signal thermal control module 205. In turn, thermal control module may then indicate (e.g. with a software interrupt) to runtime control module 207 that a temperature threshold of the memory device has been reached. Runtime control module 207 may, in response to the signal from thermal control module 205, enable at least one thermal management operation. In an embodiment, a thermal management operation may be for example include collecting temperature data, realigning thermal thresholds, enablement of a fan to cool the components on memory module 201, causing memory device 203 to undergo a different speed of refresh operation (e.g. single refresh, double refresh, single self-refresh, double self-refresh), applying a memory access rate limit to the memory device, restricting all access to the memory device, shutting down the memory controller or devices, or any other action taken to manage memory device 203 temperature.

In an embodiment, as a result of runtime control module 207 receiving a signal (e.g. software interrupt) from thermal control module 205 indicating that a temperature threshold has been reached, runtime control module 207 may read memory device 203 temperatures from thermal sensor 202.

In an embodiment, the runtime control module 207 may compute additional memory access rate limits based on temperature readings of the memory device 203 by the thermal sensor 202 over time. In other words, runtime control module 207 may log temperature over time to generate historical trend information for use in computing memory access rate limits (e.g. to compute the proportional amount of control to apply based on evaluating a closed-loop feedback equation).

In an embodiment, if the runtime control module determines that a very high or catastrophic temperature rise is likely to occur, is occurring or has occurred in the memory device, and may cause hardware or software damage, runtime control module 207 may initiate a system shutdown.

In an embodiment, a dynamic memory (e.g. DDR SRAM) may require double refresh rate when memory device 203 temperature exceeds a threshold (e.g. 85 C) in order to maintain memory integrity. In this embodiment, a refresh operation may be any operation to restore charge to a memory cell.

In an embodiment, runtime control module 207 may inspect the temperature of the memory device 203 by reading the output of thermal sensor 202. If the temperature indicates that a temperature requirement for double self-refresh is met (e.g. temperature exceeds 85 C), runtime control module 207 may cause memory device 203 to undergo a double self-refresh operation. If however the temperature indicates that only single self-refresh temperature requirements (e.g. temperature below 85 C) are met then runtime control module 207 will cause memory device 203 to undergo a single self-refresh operation.

The self-refresh operations described above may be implemented in various modes of memory module 201 operation. For example, the determination of whether single or double self-refresh should be applied can be made at boot up, resume, during normal operation, at the beginning of transition between sleep states (e.g. S0 to S1), or when the device is in a suspended state.

In an embodiment, when a device goes into a suspended state, either a single or double self-refresh rate is designated. In this embodiment, the signal from the thermal sensor may also cause the system to exit the suspended state (e.g. by wiring the hardware interrupt to PME# wake-up) upon sensing a temperature threshold for the memory device 203. If the temperature threshold exceeds the boundaries of an allowable window of temperature threshold values, the system will wake up to check the actual temperature of memory device 203. In this embodiment, thermal sensor 202 signal (e.g. hardware interrupt) arrives at the thermal control module 205. Thermal control module 205 then generates a signal (e.g. software interrupt) to runtime control module 207 which polls a temperature reading from the thermal sensor 202. If the temperature is above a window of allowable temperatures (e.g. because of an increase in ambient temperature), then runtime control module 207 may enable double self-refresh if single self-refresh had previously been in use. If the temperature is below a window of temperatures then runtime control module 207 may enable single self-refresh if double self-refresh had previously been in use. The system then may be returned to the suspended state with optimized refresh rates.

Advantageously, temperature measurements by thermal sensor may be used to prevent a double refresh operation from occurring when only a single refresh operation is needed to sustain memory integrity. Additionally, refresh rates may be increased to double self-refresh rates when required to maintain system integrity.

Figure 4:
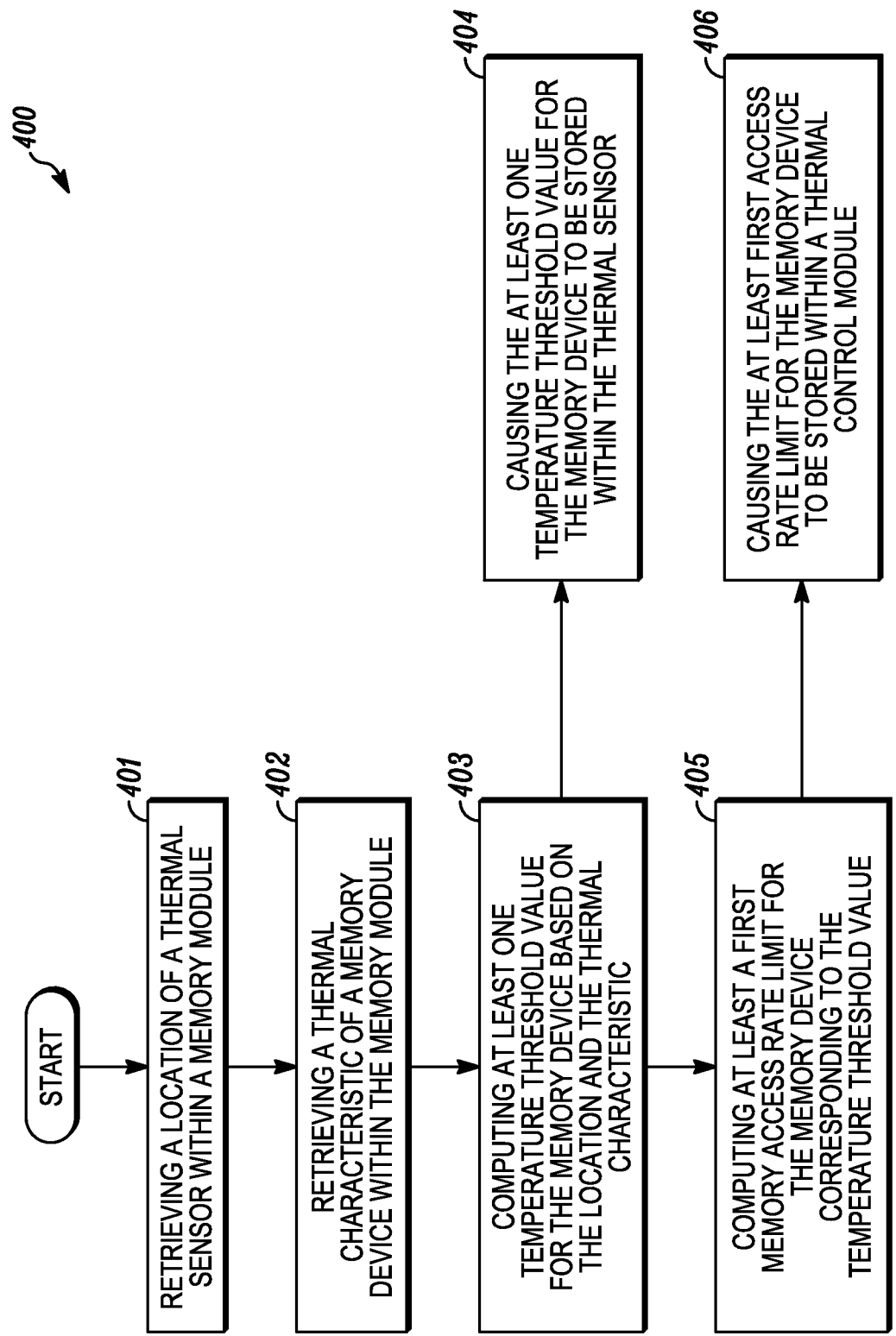
FIG. 4 is a flow diagram of an embodiment of a process for thermal management of a memory device.

FIG. 4 is a flow diagram of an embodiment of a process 400 for calibrating thermal response to memory device temperatures according to thermal sensor position and memory device thermal characteristics. The process may be performed by processing logic that may comprise hardware (e.g., circuitry, dedicated logic, programmable logic, microcode, etc.), software (such as that run on a general purpose computer system or a dedicated machine), or a combination of both. In an embodiment, process 400 is performed by an initialization control module 206 of FIG. 2.

In FIG. 4, process 400 starts with processing logic retrieving the location of a thermal sensor within a memory module (processing block 401). The sequence continues when processing logic retrieves at least one thermal characteristic of a memory device within the memory module (processing block 402).

With the information retrieved in processing blocks 401 and 402, processing logic may then compute temperature threshold values for the memory device (processing block 403) and memory access rate limits for the memory device (processing block 405). Each memory access rate may correspond to a temperature threshold value. In other words, for a given temperature threshold value, there may be an associated maximum memory access rate.

In addition to making computations, processing logic may cause temperature threshold values to be stored in the thermal sensor (processing block 404) and memory access rate limits to be stored in thermal control module (processing block 406).

Advantageously, following the discovery process described in FIG. 4, thermal management operations (e.g. applying a memory access rate limit) may be applied to manage the temperature of the memory device based on a particular thermal environment.

Figure 5:
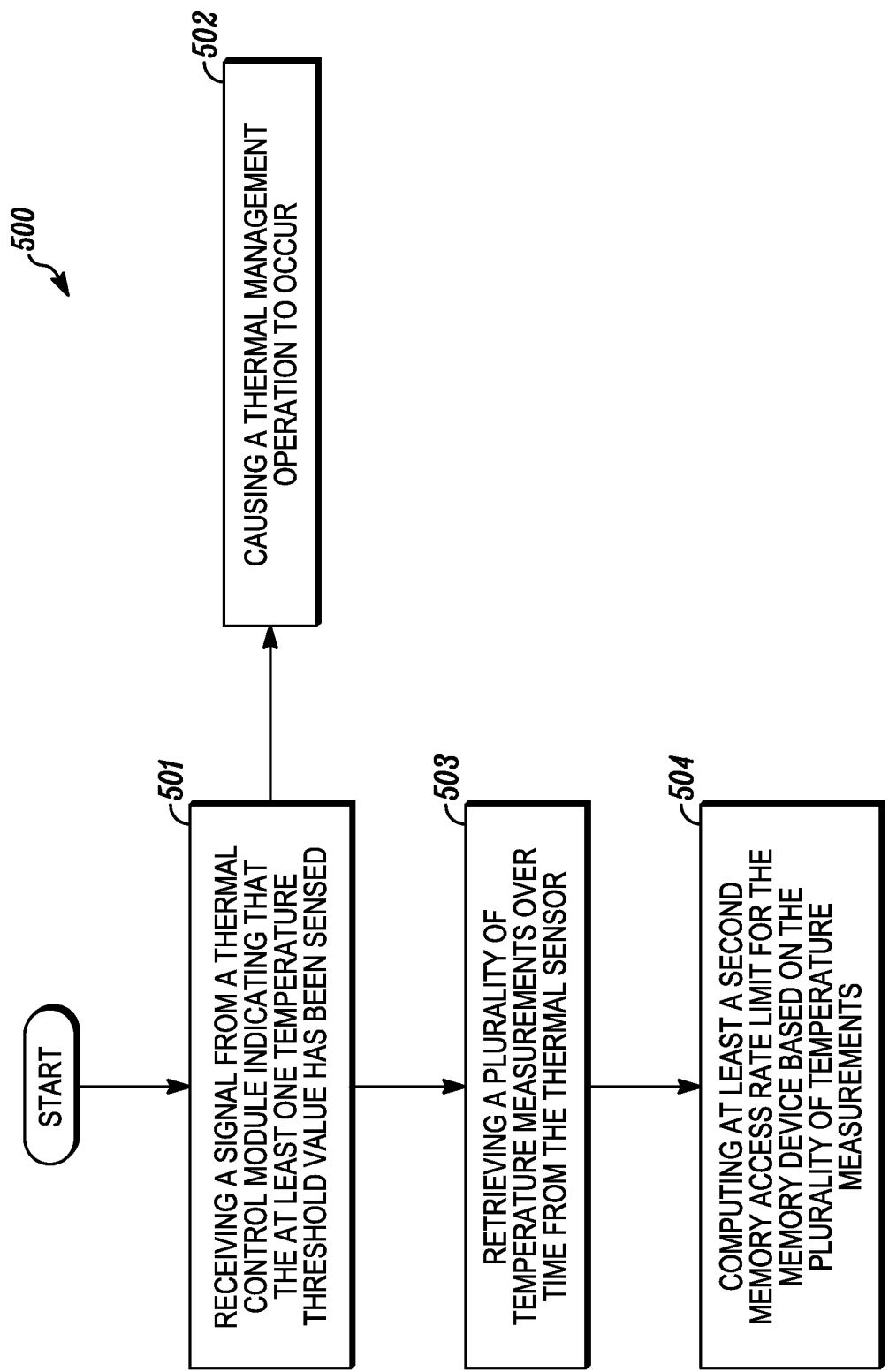
FIG. 5 s a flow diagram of an embodiment of a process for thermal management of a memory device.

FIG. 5 is a flow diagram of an embodiment of a process 500 for applying thermal management operations based on a memory device having reached a temperature threshold. In an embodiment, process 500 is performed by a runtime control module 207 of FIG. 2.

Process 500 begins with processing logic receiving a signal from a thermal control module indicating that a temperature threshold of the memory device has been sensed (processing block 501).

In order to receive this signal, runtime control module may configure thermal control module to issue a signal (e.g. a software interrupt) to the runtime control module when the thermal control module receives a signal from the thermal sensor indicating that a temperature threshold has been reached.

Processing logic may, as a result of receiving a signal from the thermal control module, cause a thermal management operation to occur (processing block 502)

As described above a thermal management operation may be for example enablement of a fan to cool the components on memory module 201, causing memory device 203 to undergo a refresh operation, applying a memory access rate limit to the memory device, restricting all access to the memory device, shutting down, or any other action in an attempt to manage memory device 203 temperature.

Process 500 continues when processing logic, in response to the signal from the thermal control module, retrieves a plurality of temperature measurements of the memory device from the thermal sensor (processing block 503).

Processing logic may then compute memory access rate limits for the memory device based on memory device temperature measurements over time (processing block 504).

Advantageously, temperature feedback supplied by the thermal sensor may be used by processing logic (e.g. runtime control module) to apply thermal management operations that are appropriate for current thermal conditions. In an embodiment, closed loop feedback control may be applied to dynamically derive a proportional memory access rate limit for the memory device in order to optimize its performance considering memory device's thermal constraints.

Figure 6:
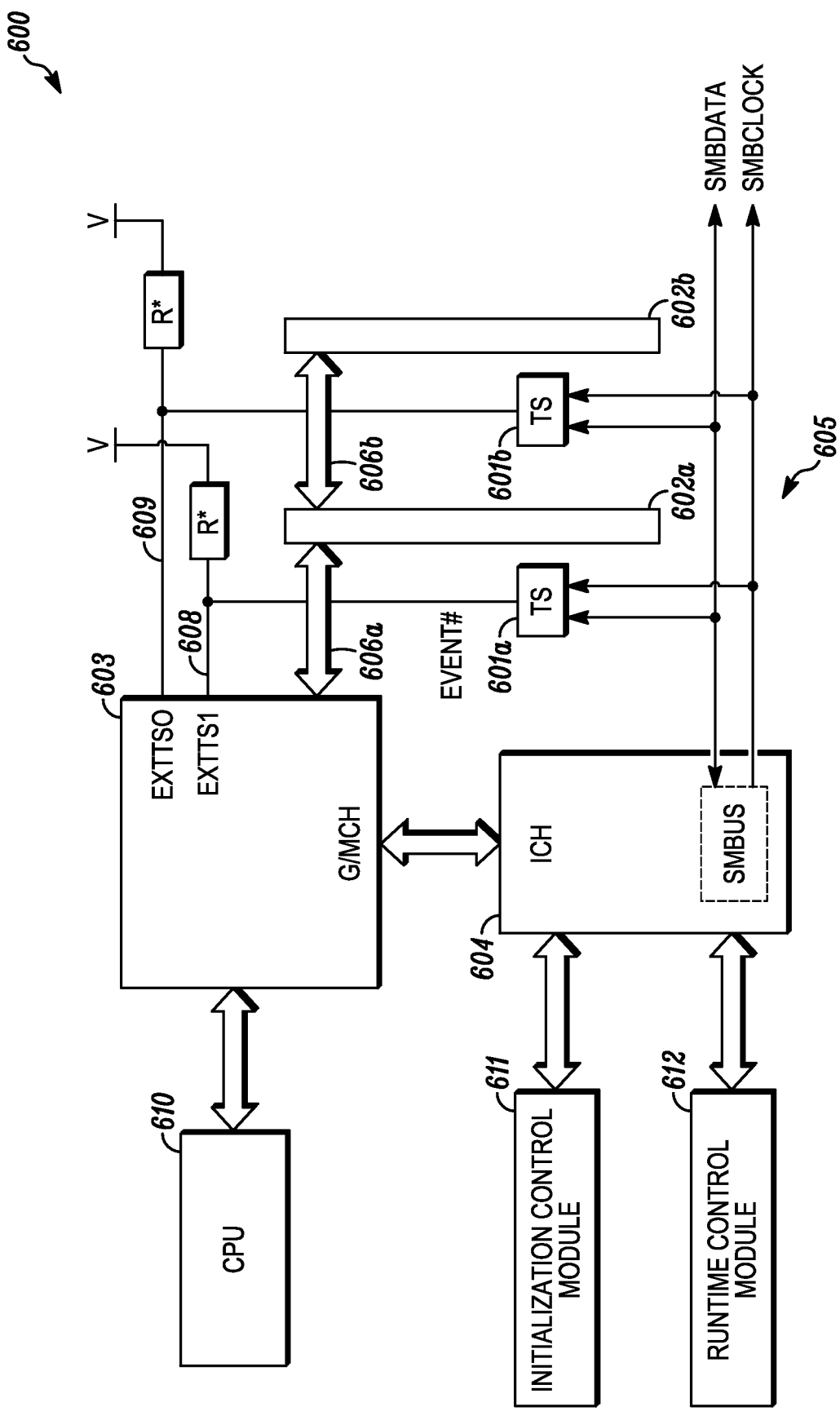
FIG. 6 illustrates a block diagram of an embodiment of a temperature control apparatus including elements used in memory device thermal management.

FIG. 6 is a block diagram of a thermal sensor and temperature threshold circuit. This embodiment includes GMCH 603 which interfaces with SO-DIMMs 602a and 602b through memory channels 606a and 606b. The memory interface to GMCH 603 may include one or more throttles which may be applied to limit overall memory access throughput on an overall or a per-channel basis. In an embodiment SO-DIMMs 602a and 602b contain memory devices (not shown) and are attached to memory channels 606a and 606b through connector slots on a board. SO-DIMMs 602a and 602b also contain SPDs which in this embodiment contain thermal sensors 601a and 602b. In this embodiment, SPDs also contain information about each thermal sensor 601a and 601b and memory device.

For example, SPD may contain the thermal sensitivity of the memory devices, the presence of any heat spreader or heat sink on the SO-DIMM, the temperature offset from sensor to memory device's heat sensitivity, the location of the thermal sensor on the SO-DIMM (e.g. top, bottom, left or right), the temperature per watt relationship between the thermal sensor and the memory device thermal sensitivity, and thermal time constant defined as the time taken to rise to 63.2% or drop to 36.8% of the difference between initial and final temperature.

Thermals sensors 601a and 601b are located on SO-DIMMs 602a and 602b may be interfaced with SMBus 605 which connects to input/output controller hub (ICH) 604. In an embodiment, outputs from thermal sensors 601a and 601b connect to GMCH 603 via pins 608 and 609 of the edge connectors for SO-DIMMs 602a and 602b. In an embodiment, by using an open drain active low signal, a per board single signal pin may be connected to multiple devices, or between multiple boards, producing one signal to GMCH 603.

Referring to FIG. 6, during boot up or resume, initialization control module 611 may probe SPD via SMBus 605 for information about each thermal sensor 601a and 601b and memory device 601a and 601b stored within the SPD.

Additionally, the system firmware may contain information that may be used to modify temperatures measured by the thermal sensors 601a and 601b. (e.g direction of the air flow over the SO-DIMM 602a and 602b when the fan is on, whether top facing thermal sensor is facing air flow or is located under SO-DIMM 602a and 602b (e.g. because a SO-DIMM is inserted upside-down).

Initialization control module 611 may then probe the SPD and thermal sensor 601a and 601b location within SMBus 605 slave address range and verify the version and capabilities of the thermal sensor 601a and 601b interface. Initialization control module 611 may also check to see if temperature thresholds are already set and locked in the thermal sensor 601a and 601b.

In this embodiment, initialization control module 611 then uses the information about the thermal sensors 601a and 601b and memory devices 601a and 601b to compute a hierarchy of temperature thresholds for the memory devices in order of ascending priority (e.g. alarm and critical trip points).

Initialization control module 611 may then store the computed temperature thresholds to the registers of the thermal sensors 601a and 601b. Locks bits may be used to prevent subsequent modification of the temperature threshold values in the registers of the thermal sensor until a power cycle or reset occurs.

Initialization control module 611 may then configure GMCH 603 (e.g. thermal control module) to throttle a memory device according to computed throttling rates when GMCH 603 (e.g. thermal control module) receives a trip (e.g. temperature threshold) signal from either thermal sensor 601a or 601b. In an embodiment, registers of GMCH 603 (e.g. thermal control module) may be locked to prevent modification of throttles (e.g. memory access rate limit) or trip points (e.g temperature threshold values).

In operation of this embodiment, when thermal sensor 601a or 601b determines that the temperature of a memory device on SO-DIMM 602a or 602b has reached a temperature threshold value stored in the thermal sensor 601a or 601b registers, thermal sensor 601a or 601b then signals GMCH 603 (e.g. thermal control module) over pins 608 or 609. GMCH (e.g. thermal control module) then applies to the memory corresponding to the source of the hardware interrupt one or more pre-programmed hardware responses such as throttling the memory or shutdown.

Runtime control module 612 may program thermal sensors 601a and 601b to signal GMCH 603 (e.g. thermal control module) upon sensing additional specific or targeted temperatures (e.g. temperature thresholds). Runtime control module 612 may also cause GMCH 603 (e.g. thermal control module) to issue software interrupts to runtime control module 612 upon receiving temperature threshold signals from either thermal sensor 601a or 601b.

As stated above, a per board single signal pin may be connected to multiple devices, or between multiple boards, producing one signal to GMCH 603. Runtime control module 612 determines the thermal sensor 601a or 601b from which a signal originated. During operation, runtime control module 612 may first determine that a thermal sensor 601a or 601b was the underlying cause of the software interrupt. Second, runtime control module 612 may then enumerate each of the thermal sensors 601a and 601b and determine which trip (e.g. temperature threshold) caused the event. Third, runtime control module 612 may interrogate the particular thermal sensor 601a or 601b to determine which particular trip (e.g. temperature threshold) caused the interrupt.

If a high-temperature trip is involved, runtime control module 612 may choose to enable fans, enable throttling on the memory device or on other device, enable memory double self-refresh mode or other such actions. Runtime control module 612 may note the temperature, logging it for future comparison and in order to generate historical trend information (integral, differential) e.g to compute the amount of control to apply to existing memory access rate limit based on evaluating a closed-loop feedback equation. If a very high or catastrophic temperature rise was occurring which could cause hardware or software damage, runtime control module 612 may initiate a system shutdown.

Figure 7A:
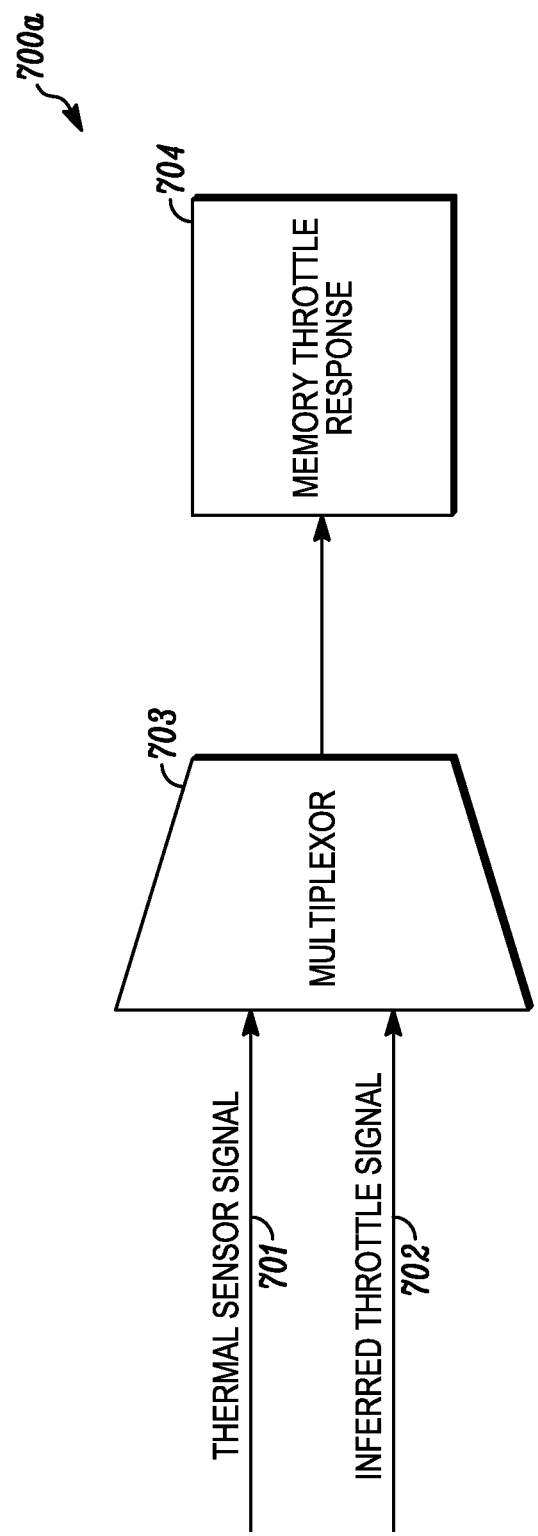
FIG. 7a is a block diagram illustrating an embodiment of controlling memory access rates of a memory device.

FIG. 7a is a block diagram of a thermal sensor signal 701 combined with an inferred throttle control signal 702 to control memory access rate limits of a memory device with a memory throttle response 704. An inferred throttle control signal 702 may be, for example, based on an inferred temperature (e.g. where temperature used for calculating throttle is based less upon direct measurement than the thermal sensor described herein). Advantageously, this embodiment combines different methods of providing temperature control for a memory device.

Figure 7B:
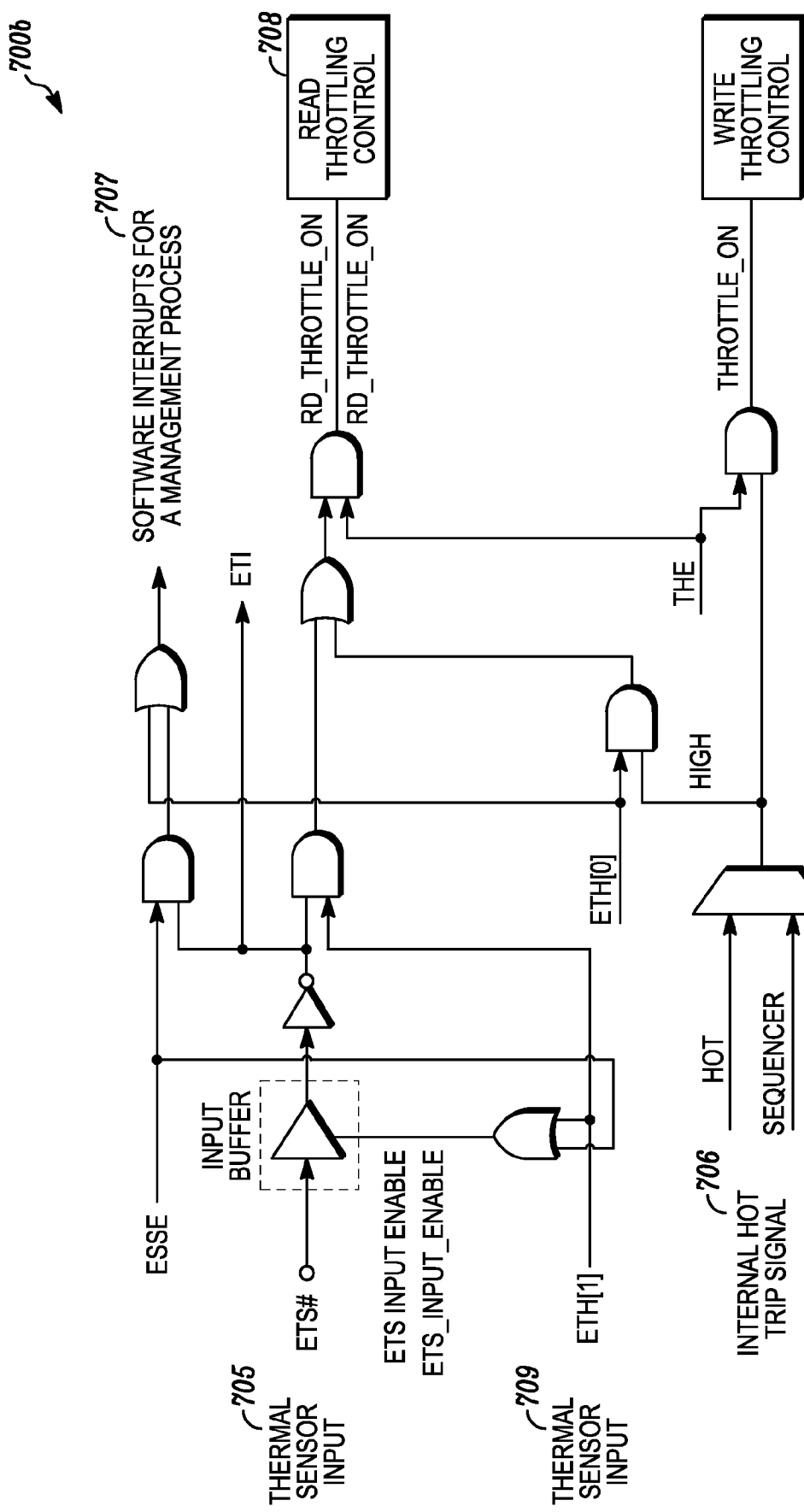
FIG. 7b is a schematic of a circuit utilizing internal and external thermal signals for thermal management.

FIG. 7b is a schematic of a circuit utilizing internal and external thermal signals for thermal management. In an embodiment, input from thermal sensor 705 may also be used in concert with internal hot trip signal 706 to generate software interrupts for a management process 707 (e.g. system management interrupt (SMI), peripheral connection interrupt (PCI), advanced configuration and power interface (ACPI) interrupt). Thermal sensor input may also be along with inferred throttle signal 709 to control read throttling 708 for a memory device.

Figure 8:
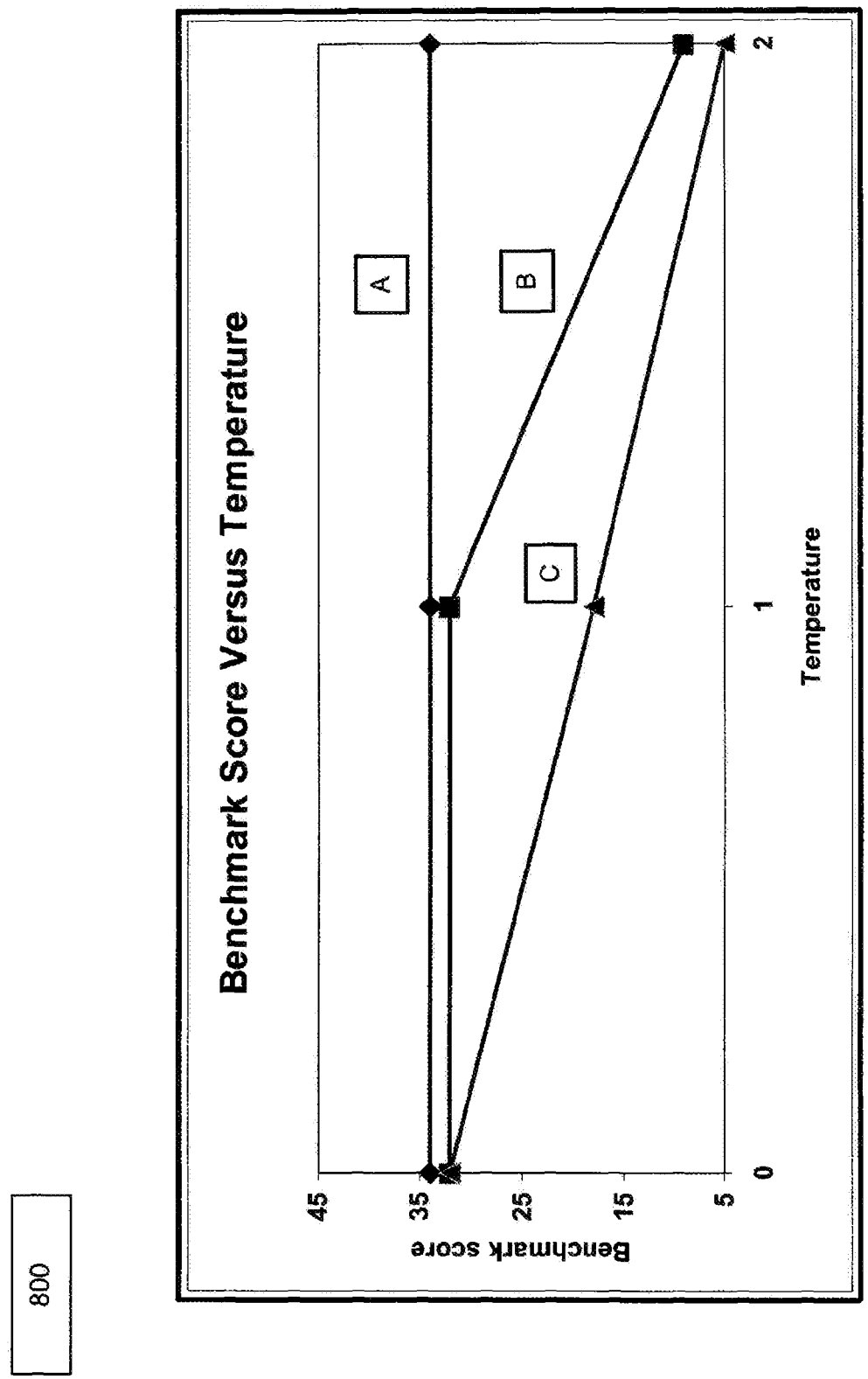
FIG. 8 is a graph comparing data transfer performance for different methods of memory device thermal control.

FIG. 8 is a graph comparing data transfer performance for different methods of measuring the temperature of a memory device.

Memory bandwidth directly impacts system and data rate performance. Minimizing the amount of guardband (e.g. accounting for error) necessary when applying a thermal throttling response to temperature conditions is critical for achieving full capability of a memory device and components interacting with a memory device.

In the benchmark analysis, applications have been run on A) Unthrottled systems, B) systems using Thermal Sensor based throttling, C) Fixed Bandwidth based throttling. The diagram shows that the performance of the temperature sensor controlled system retains highest performance of the two thermal management options relative to the unthrottled behavior, noting that the unthrottled configuration is not thermally viable.

Advantageously, embodiments described herein allow for reduced guardbanding compared to prior art, and thus, improved data rate performance. Additionally, thermal management operations may be optimized based on direct temperature readings of a memory device by a thermal sensor. Embodiments involving a thermal sensor's measurement of memory device temperature allow calculation of temperature thresholds and memory access rate limits that yield better data rate performance over prior art. Embodiments describe the use of actual thermal sensors associated with the memory device, and direct hardware control of chipset memory throttles through thermal sensor signaling.

Thus, a method and apparatus for thermal management in a memory device has been described. It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

The invention claimed is:

1. An apparatus comprising:
   a thermal control module having an input port to receive a signal indicating that one of a plurality of temperature thresholds associated with a memory device has been reached from a thermal sensor, wherein the thermal control module to initiate a thermal management operation based on the signal and the thermal sensor thermally couples to the memory device to measure a temperature of the memory device; and
   an initialization control module to receive a location of the thermal sensor and to store at least one of the plurality of temperature thresholds for the memory device within the thermal sensor.

2. The apparatus of claim 1, the initialization control module to receive a thermal characteristics of the memory device, wherein the initialization control module to compute at least one of the plurality of temperature thresholds for the memory device and to compute at least one of a plurality of memory access rate limits for the memory device based on the location of the thermal sensor and the thermal characteristics of the memory device.

3. The apparatus of claim 2, wherein the location of the thermal sensor is selected from the group consisting of a memory module containing the memory device with the thermal sensor as a stand alone device, inside a second memory on the memory module, and inside the memory device itself.

4. The apparatus of claim 2, wherein the initialization control module to store at least one of the plurality of memory access rate limits for the memory device within the thermal control module, and the thermal control module to apply one of the plurality of memory access rate limits to the memory device based on the signal indicating that one of a plurality of temperature thresholds of the memory device has been reached.

5. The apparatus of claim 2, wherein the initialization control module to retrieve the location of the thermal sensor and the thermal characteristics of the memory device from a second memory device.

6. The apparatus of claim 1 further comprising:
   a runtime control module to receive a signal from the thermal control module indicating that at least one of the plurality of temperature thresholds of the memory device has been reached.

7. The apparatus of claim 6, wherein the runtime control module to enable at least one thermal management operation based on the signal from the thermal control module indicating that at least one of the plurality of temperature thresholds of the memory device has been reached.

8. The apparatus of claim 7, wherein at least one thermal management operation is selected from the group of collecting temperature data, realigning thermal thresholds, enabling fans, causing the use of a different memory refresh operation speed to or within a memory device, limiting one of the plurality of memory access rate limits to the memory device, and shutting down the memory controller or the memory device.

9. The apparatus of claim 6, wherein the thermal control module responsive to the signal to cause the runtime control module to retrieve a plurality of temperature readings of the memory device over time, from the thermal sensor; and the runtime control module to compute and apply one of a plurality of memory access rate limits for the memory device, based on the plurality of temperature readings of the memory device over time, from the thermal sensor.

10. A system comprising:
- a thermal sensor thermally coupled to a memory device to issue a signal indicating that a temperature threshold of the memory device has been reached;
- a thermal control module to receive the signal indicating that the temperature threshold of a memory device has been reached, and to initiate a thermal management operation based on the signal;
- a power supply to power the memory device and the thermal sensor; and
- an initialization control module to receive a location of the thermal sensor and to store the temperature threshold for the memory device within the thermal sensor.

11. The system of claim 10, the initialization control module to receive thermal characteristics of the memory device, and to compute the temperature threshold for the memory device, and to compute a first memory access rate limit for the memory device, based on the location of the thermal sensor and the thermal characteristics of the memory device.

12. The system of claim 11, wherein the initialization control module to retrieve the location of the thermal sensor and the thermal characteristics of the memory device from within a second memory device.

13. The system of claim 10, wherein the location of the thermal sensor is selected from the group consisting of a memory module containing the memory device with the thermal sensor as a stand alone device, inside a second memory on the memory module, and inside the memory device itself.

14. The system of claim 10, wherein the initialization control module to store the first memory access rate limit for the memory device within the thermal control module; and
- the thermal control module to apply the rate limit to the memory device based on the signal indicating that the temperature threshold of the memory device has been reached.

15. The system of claim 10 further comprising:
- a runtime control module to receive a signal from the thermal control module indicating that the temperature thresholds of the memory device has been reached.

16. The system of claim 15, wherein the runtime control module to enable a thermal management operation based on the signal from the thermal control module indicating that the temperature threshold of the memory device has been reached.

* * * * *